United States Patent
Andry et al.

(10) Patent No.: US 10,381,255 B2
(45) Date of Patent: Aug. 13, 2019

(54) DOUBLE LAYER RELEASE TEMPORARY BOND AND DEBOND PROCESSES AND SYSTEMS

(71) Applicant: International Business Machines Corporation, Armonk, NY (US)

(72) Inventors: Paul S. Andry, Yorktown Heights, NY (US); Russell A. Budd, North Salem, NY (US); Bing Dang, Chappaquah, NY (US); Li-Wen Hung, Mahopac, NY (US); John U. Knickerbocker, Monroe, NY (US); Cornelia Kang-I Tsang, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/214,422

(22) Filed: Dec. 10, 2018

(65) Prior Publication Data
US 2019/0115243 A1 Apr. 18, 2019

Related U.S. Application Data

(60) Continuation of application No. 15/215,658, filed on Jul. 21, 2016, now Pat. No. 10,224,229, which is a (Continued)

(51) Int. Cl.
*B23K 26/57* (2014.01)
*B32B 43/00* (2006.01)
(Continued)

(52) U.S. Cl.
CPC .......... *H01L 21/6835* (2013.01); *B23K 26/57* (2015.10); *B32B 43/006* (2013.01);
(Continued)

(58) Field of Classification Search
CPC ............. B32B 43/006; Y10T 156/1158; Y10T 156/1917; Y10S 156/93; Y10S 156/941; B23K 26/57
See application file for complete search history.

(56) References Cited

U.S. PATENT DOCUMENTS

| 5,304,626 A | 4/1994 | Burgess et al. |
| 6,211,499 B1 | 4/2001 | Morrow et al. |
| (Continued) | | |

FOREIGN PATENT DOCUMENTS

| CN | 1816908 A | 8/2006 |
| CN | 1854204 A | 11/2006 |
| (Continued) | | |

OTHER PUBLICATIONS

P. Andry et al.; "Advanced Wafer Bonding and Laser Debonding"; 2014 Electronic Components & Technology Conference; pp. 883-887.
(Continued)

*Primary Examiner* — Mark A Osele
(74) *Attorney, Agent, or Firm* — Harrington & Smith

(57) ABSTRACT

A bonded structure contains a substrate containing at least one feature, the substrate having a top surface; a first release layer overlying the top surface of the substrate, the first release layer being absorptive of light having a first wavelength for being decomposed by the light; an adhesive layer overlying the first release layer, and a second release layer overlying the adhesive layer. The second release layer is absorptive of light having a second wavelength for being decomposed by the light having the second wavelength. The bonded structure further contains a handle substrate that overlies the second release layer, where the handle substrate is substantially transparent to the light having the first wavelength and the second wavelength. Also disclosed is a debonding method to process the bonded structure to
(Continued)

remove and reclaim the adhesive layer for re-use. In another embodiment a multi-step method optically cuts and debonds a bonded structure.

11 Claims, 6 Drawing Sheets

Related U.S. Application Data division of application No. 14/535,822, filed on Nov. 7, 2014, now abandoned.

(51) Int. Cl.
 H01L 21/683 (2006.01)
 H01L 21/78 (2006.01)
 H01L 21/67 (2006.01)
 H01L 23/544 (2006.01)

(52) U.S. Cl.
 CPC ........ *H01L 21/67092* (2013.01); *H01L 21/78* (2013.01); *B32B 2457/14* (2013.01); *H01L 23/544* (2013.01); *H01L 2221/6834* (2013.01); *H01L 2221/68318* (2013.01); *H01L 2221/68327* (2013.01); *H01L 2221/68381* (2013.01); *H01L 2223/54426* (2013.01); *H01L 2223/54453* (2013.01); *H01L 2224/94* (2013.01); *H01L 2924/10253* (2013.01); *H01L 2924/14* (2013.01); *Y10S 156/93* (2013.01); *Y10S 156/941* (2013.01); *Y10T 156/1158* (2015.01); *Y10T 156/1917* (2015.01)

(56) References Cited

U.S. PATENT DOCUMENTS

| | | | |
|---|---|---|---|
| 7,473,866 B2 * | 1/2009 | Morishige | B23K 26/0613 219/121.76 |
| 7,507,312 B2 | 3/2009 | Bossi et al. | |
| 7,534,498 B2 | 5/2009 | Noda et al. | |
| 8,181,688 B2 | 5/2012 | Johnson et al. | |
| 8,986,497 B2 | 3/2015 | Sercel et al. | |
| 9,111,983 B1 | 8/2015 | Ginter et al. | |
| 2004/0038519 A1 | 2/2004 | Yanagisawa et al. | |
| 2005/0194606 A1 * | 9/2005 | Oohata | H01L 24/82 257/99 |
| 2007/0051469 A1 | 3/2007 | Bossi et al. | |
| 2011/0014774 A1 | 1/2011 | Johnson et al. | |
| 2014/0102643 A1 | 4/2014 | Porneala et al. | |
| 2014/0103499 A1 | 4/2014 | Andry et al. | |
| 2014/0106473 A1 | 4/2014 | Andry et al. | |
| 2014/0144593 A1 | 5/2014 | Dang et al. | |
| 2014/0342148 A1 | 11/2014 | Bookbinder | |
| 2015/0083343 A1 | 3/2015 | Fujii et al. | |
| 2015/0104929 A1 * | 4/2015 | Lei | H01L 21/78 438/462 |
| 2015/0111364 A1 * | 4/2015 | Lei | H01L 21/3065 438/462 |
| 2015/0194331 A1 | 7/2015 | Bai | |
| 2016/0329233 A1 | 11/2016 | Andry et al. | |

FOREIGN PATENT DOCUMENTS

| | | |
|---|---|---|
| CN | 102272926 A | 12/2011 |
| CN | 20334524 | 12/2013 |
| EP | 2404697 A1 | 1/2012 |
| WO | 2014037829 A1 | 3/2014 |

OTHER PUBLICATIONS

M. Zoberbier et al.; "Latest Insights in Thin Wafer Handling Technologies"; Chip Scale Review; Jul./Aug. 2013; pp. 54-57.
"ZoneBOND® Thin-Wafer-Handling Technology"; Downloaded from the Internet Nov. 2014; URL: http://www.brewerscience.com/products/temporary-bonding-materials/zonebond; whole document (4 pages).

* cited by examiner

9A: PROVIDING A BONDED STRUCTURE THAT COMPRISES A FIRST SUBSTRATE CONTAINING AT LEAST ONE FEATURE, THE FIRST SUBSTRATE HAVING A TOP SURFACE AND AN OPPOSED BOTTOM SURFACE; AN ADHESIVE LAYER OVERLAYING THE TOP SURFACE OF THE FIRST SUBSTRATE; A RELEASE LAYER OVERLAYING THE ADHESIVE LAYER; THE RELEASE LAYER BEING ABSORPTIVE OF LIGHT HAVING A PREDETERMINED WAVELENGTH FOR BEING AT LEAST ONE OF DECOMPOSED, ABLATED AND VAPORIZED BY THE LIGHT HAVING THE SECOND WAVELENGTH; AND A SECOND SUBSTRATE HAVING A BOTTOM SURFACE OVERLAYING THE RELEASE LAYER AND AN OPPOSED TOP SURFACE, THE SECOND SUBSTRATE BEING SUBSTANTIALLY TRANSPARENT TO THE LIGHT HAVING THE PREDETERMINED WAVELENGTH

9B: APPLYING A FOCUSED BEAM OF LIGHT TO THE BONDED STRUCTURE TO CUT THROUGH THE RELEASE LAYER, THE ADHESIVE LAYER AND THE FIRST SUBSTRATE TO FORM AT LEAST TWO BONDED SUB-STRUCTURES, WHERE THE SECOND SUBSTRATE IS SUBSTANTIALLY TRANSPARENT TO THE FOCUSED BEAM OF LIGHT

9C: APPLYING LIGHT HAVING THE PREDETERMINED WAVELENGTH TO THE BONDED STRUCTURE TO AT LEAST ONE OF DECOMPOSE, ABLATE AND VAPORIZE THE RELEASE LAYER THEREBY DEBONDING THE AT LEAST TWO BONDED SUB-STRUCTURES FROM THE SECOND WAFER OR SURFACE

FIG. 9

DOUBLE LAYER RELEASE TEMPORARY BOND AND DEBOND PROCESSES AND SYSTEMS

CROSS-REFERENCE TO A RELATED PATENT APPLICATION

This patent application is a continuation patent application of U.S. patent application Ser. No. 15/215,658, filed Jul. 21, 2016, now U.S. Pat. No. 10,224,229, which is a divisional patent application of U.S. patent application Ser. No. 14/535,822, filed Nov. 7, 2014, the disclosures of which are incorporated by reference herein in their entireties.

TECHNICAL FIELD

The exemplary embodiments of this invention relate generally to semiconductor devices, semiconductor packaging, materials, sensors, biomedical components, touchscreen displays, miniaturization of components and subcomponents, fabrication techniques, equipment, methods and, more specifically, relate to wafer bonding and debonding materials, processes, etching processes, cutting processes, reuse of materials processes and tooling using one or more lasers.

BACKGROUND

Temporary wafer, panel or layer bonding and debonding are key enabling processes in three dimensional (3D) semiconductor technologies and in miniaturization of electronics and components. Debonding is the act of removing a processed silicon device wafer, panel or layer from a substrate or handling wafer or panel so that the processed silicon device wafer may be added to a 3D stack or used in a system after thinning, processing or miniaturization of the size of the layer. As an example, there exist a number of approaches to the debonding of thinned device wafers: they may be released by exposure to chemical solvents delivered through perforations in the handler, by mechanical peeling from an edge-initiated separation point, or by heating the adhesive to the point where the silicon device wafer may be removed by sheering or peeling. Room-temperature debonding techniques, which include laser-assisted debonding as well as mechanical peeling are gaining wider acceptance than other methods due to their compatibility with standard dicing tape frame mounting and materials. Ultraviolet (UV) laser ablation using an excimer source in combination with an x-y scanning stage has previously been demonstrated to effectively debond wafers that have been bonded using polyimide-based adhesives. At the same time, a number of mechanical debonding approaches have arisen that rely on controlled peeling of a handler from a thinned wafer, for example by engineering the handler to have a central low-adhesion zone, or by the application of a special release layer to the wafer before bonding.

A problem that arises in the context of conventional wafer debonding techniques relates to the costs associated with the bonding adhesive and chemical cleaning.

SUMMARY

In one non-limiting embodiment of this invention a bonded structure comprises a first substrate containing at least one feature, the first substrate having a top surface and an opposed bottom surface. The bonded structure further comprises a first release layer overlying the top surface of the first substrate, where the first release layer is absorptive of light having a first wavelength for being at least one of decomposed, ablated and vaporized by the laser light having the first wavelength. The bonded structure further comprises an adhesive layer overlying the first release layer, and a second release layer overlying the adhesive layer. The second release layer is absorptive of light having a second wavelength for being at least one of decomposed, ablated and vaporized by the light having the second wavelength. The bonded structure further comprises a second substrate that overlies the second release layer, where the second substrate is substantially transparent to the light having the first wavelength and to the light having the second wavelength.

In another non-limiting embodiment of this invention there is provided a method that comprises providing a bonded structure that comprises a first substrate containing at least one feature, the first substrate having a top surface and an opposed bottom surface; a first release layer overlying the top surface of the first substrate, the first release layer being absorptive of light having a first wavelength for being at least one of decomposed, ablated and vaporized by the light having the first wavelength; an adhesive layer overlying the first release layer; a second release layer overlying the adhesive layer; the second release layer being absorptive of light having a second wavelength for being at least one of decomposed, ablated and vaporized by the light having the second wavelength; and a second substrate overlying the second release layer, the second substrate being substantially transparent to the light having the first wavelength and to the light having the second wavelength. The method further comprises applying light having the first wavelength and the second wavelength to the bonded structure to at least one of decompose, ablate and vaporize the first release layer and the second release layer thereby debonding the second wafer from the structure. The method further comprises removing the adhesive layer.

In a still further non-limiting embodiment of this invention there is provided a method that comprises providing a bonded structure that comprises a first substrate containing at least one feature, the first substrate having a top surface and an opposed bottom surface; an adhesive layer overlying the top surface of the first substrate; a release layer overlying the adhesive layer; the release layer being absorptive of light having a predetermined wavelength for being at least one of decomposed, ablated and vaporized by the light having the second wavelength; and a second substrate having a bottom surface overlying the release layer and an opposed top surface, the second substrate being substantially transparent to the light having the predetermined wavelength. The method further comprises applying a focused beam of light to the bonded structure to cut through the release layer, the adhesive layer and the first substrate to form at least two bonded sub-structures, the second substrate being substantially transparent to the focused beam of light. The method further comprises applying light having the predetermined wavelength to the bonded structure to at least one of decompose, ablate and vaporize the release layer thereby debonding the at least two bonded sub-structures from the second wafer or surface.

BRIEF DESCRIPTION OF THE SEVERAL VIEWS OF THE DRAWINGS

FIG. 6 shows a laser cutting (scribing) operation and FIG. 7 shows a laser debonding operation.

FIG. 9 is a flow chart descriptive of a second method of this invention.

DETAILED DESCRIPTION

Figure 1:
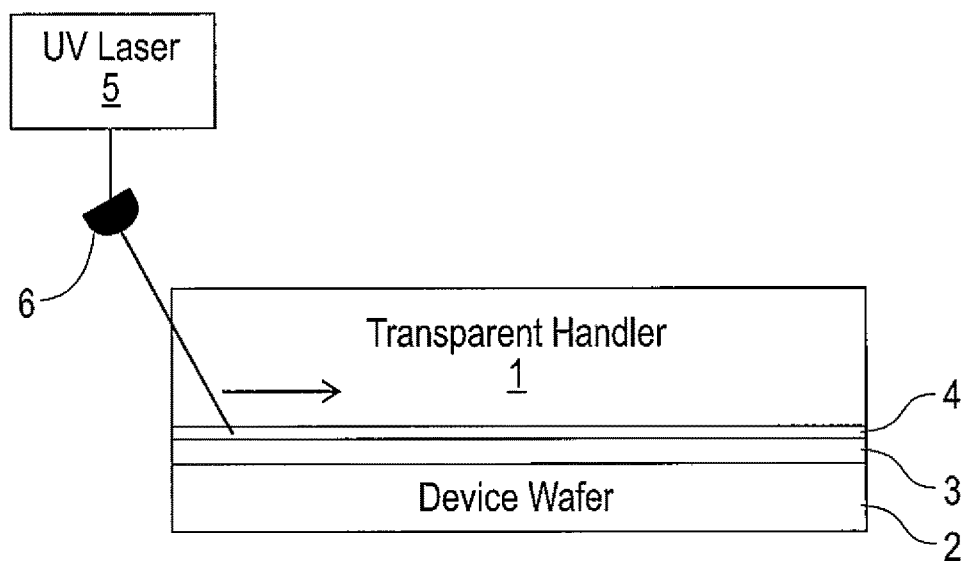
FIG. 1 is an enlarged cross-sectional view that illustrates a debonding process carried out with a bonded adhesive interface between a handler wafer and a device wafer.

By way of introduction, FIG. 1 is a simplified depiction of a debonding process with an adhesive interface 3 between a handler structure or handler wafer 1 (e.g., a glass handler) and a 3D device wafer 2 (e.g., a silicon wafer). A thin ablation layer 4 directly adjacent to the glass handler 1 is rapidly decomposed by a rapidly scanned beam from a laser 5 (e.g., a UV laser emitting a wavelength to which the handler 1 is substantially transparent) via some scanning optics 6. This process causes the release of the handler 1 leaving the bonding adhesive 3 on the 3D device wafer 2.

The handler 1, the ablation layer 4 and the adhesive 3 each have important roles to play. It is assumed that the silicon and coefficient of thermal expansion (CTE) matched glass handler have a high percent transmission of the UV wavelength chosen for maximum efficiency of release.

In general the ablation layer 4 should bond well to both the glass handler 1 and the adhesive 3, it should exhibit good chemical and thermal stability to withstand bonding and downstream processing, and it should be sensitive to the UV laser wavelength so that it will cleanly and rapidly decompose. For ease of 3D process development, especially in the area of defect inspection, it is highly advantageous for the ablation layer 4 to be thin enough for direct optical viewing of the bonded interface throughout 3D processing. However, alternative release layers which are not capable of supporting visual inspection may also be deployed and where needed alternative inspection techniques such as, but not limited to, ultrasonic inspection may be used. The bonding adhesive 3 can be any suitable bonding adhesive the application requires, subject to the condition that it supports being cleanly removed from the device wafer 2 after ablation. This condition favors adhesives that are typically dissolved in any one of a number of cleaning solvents.

Several criteria can be considered in determining the optimum wavelength for the application. The first is transmission of the glass handler 1 (or alternate handle wafer, panel or surface such as but limited to silicon, sapphire, ceramic, plastic or composite material) as mentioned above; the second is availability, cost and characteristics of the laser source 5; and the third is the availability and sensitivity of suitable ablation materials for the ablation (release) layer 4.

Figure 2:
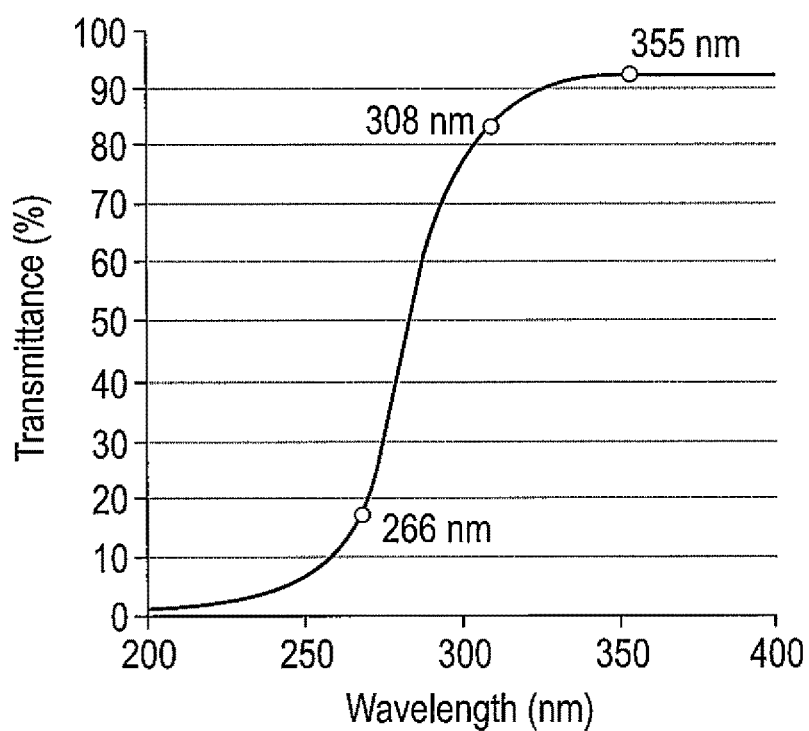
FIG. 2 shows a non-limiting example of the UV transmission characteristics of a 0.7 mm sheet of typical silicon CTE-matched wafer glass.

FIG. 2 shows a non-limiting example of the transmission characteristics of a 0.7 mm sheet of typical silicon CTE-matched wafer glass. Three common UV laser wavelengths are shown marked on the graph at 355 nm, 308 nm and 266 nm. Of these, only the 355 nm wavelength shows very little absorption loss, having the same 92% transmission as the visible spectrum (assuming a 4% Fresnel reflective loss at front and back surfaces). Transmission at 308 nm is about 83% indicating very slight absorption, while transmission at 266 nm is barely 20% indicating very strong absorption. Since the goal is to transmit a high level of laser radiation through the glass (or alternate) handle structure (e.g., wafer) 1 to the ablation layer 4, the results show that 266 nm is a poor choice relative to a 308 nm or 355 nm wavelength for this glass. For use of a silicon handle wafer, an IR laser can be utilized. For alternate handle materials, the choice of laser can be matched to desirable transmission characteristics of the handle material. In addition, it is preferred that the laser cause no or minimal damage to the handle materials to permit multiple reuse of the handle wafer 1, material or surface where appropriate.

Good debonding of glass coated with a polyimide-based adhesive using the 308 nm wavelength from a XeCl excimer laser has been shown. In this case a portion of the adhesive itself served as the ablation layer, and a relatively high-power line beam (~50 mm wide) was scanned across the wafer using a moving stage. However, the absorption layer can be decoupled from the adhesive thereby giving the process integrator much more latitude in choosing the proper adhesive for a specific application. Furthermore, a much more compact diode-pumped solid state (DPSS) 355 nm laser source can be employed. While excimer lasers have large output powers, they are also physically quite large, have complicated waveguides for steering of the beam, and require gas cabinets to house the halogen gas mixtures with which they are charged. In contrast, DPSS sources are physically much smaller, with simple rack-mounted power supplies, and fiber optic delivery of the fundamental 1064 nm laser output to a compact laser head containing the third harmonic generation crystal which "triples down" the frequency to 355 nm. While the maximum output power is lower than that of a typical excimer laser, the output beam produces a slightly elliptical Gaussian spot which can be quickly rastered across the wafer surface using an optical scanner.

Figure 3:
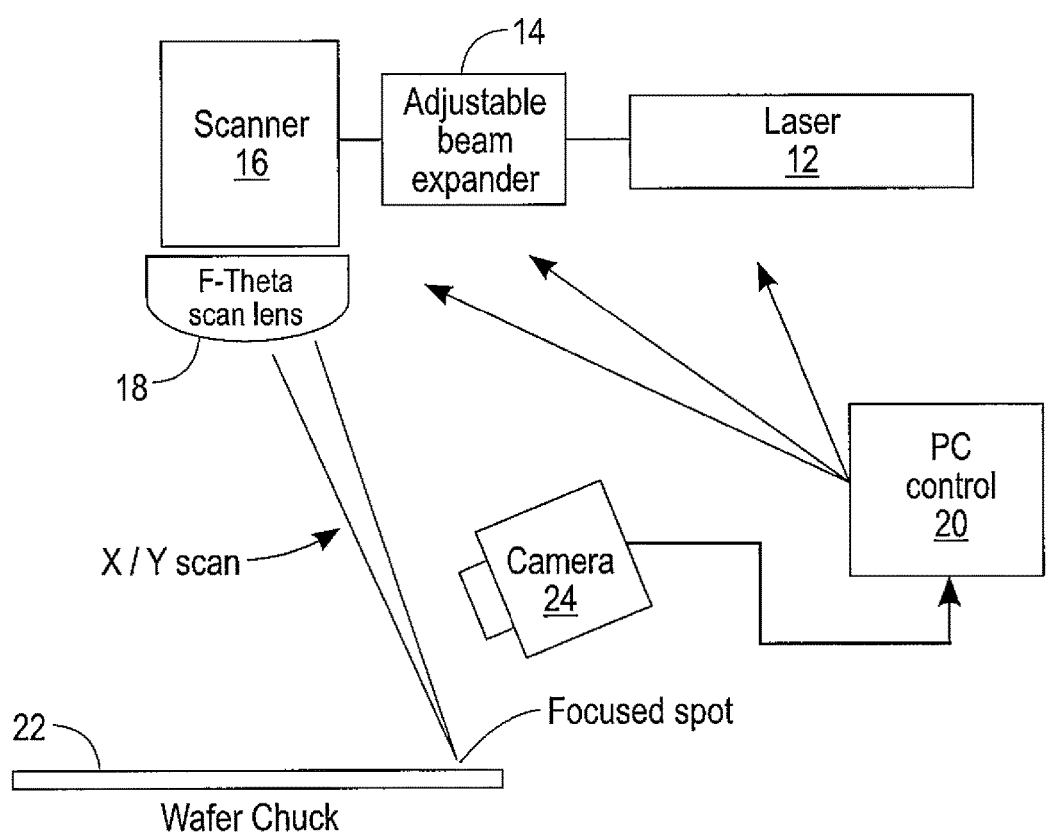
FIG. 3 illustrates a non-limiting example of a laser ablation debonding system.

FIG. 3 illustrates one non-limiting example of a laser ablation debonding system 10. The system is comprised of a number of components including: a 355 nm DPSS Q-switched laser 12 with beam expander 14, a high-speed optical scanner 16, an F-theta lens 18 and a controller, such as a PC 20, containing appropriate control software and an interface card for connecting with the controlled components. The laser 12 outputs a maximum power of for example, less than 6 Watts at a 50 kHz repetition rate and an approximately 12 ns pulse width. A 1 mm nominal width beam enters the beam expander 14 and the variably expanded beam is input to the optical scanner 16. The (x-y) scanning output beam is focused by the F-theta lens 18 onto a chuck-mounted wafer 22 placed ~800 mm below. The laser 12 and the scanner 16 are controlled by the PC 20. The system 10 can, in one example, raster scan spot sizes on the order of one to several hundred microns at speeds in excess of 10 m/s.

Knowledge of the effective spot dimension at the wafer surface is important in selecting the proper scanning parameters for uniform ablation and release of the handler. However, unlike other laser systems having line beams with a uniform "top hat" cross-section, the system 10 can produce a slightly elliptical spot having a Gaussian cross-section. The effective spot size can be defined as the Full Width Half Maximum (FWHM) point because it can be measured in a fairly straightforward way. Assuming a Gaussian distribution, a spot size defined by its FWHM captures ~50% of the total pulse power within the area of the spot. Knowledge of the spot size along with selection of laser power and scanning parameters allows a uniform ablation fluence to be delivered to the bonded interface. For illustrative purposes a normalized Gaussian of sigma=1 is used. The scanning direction can be left to right and back in a serpentine pattern.

So long as the minimum ablation threshold fluence set by the laser peak power is met at all locations, the handler wafer 1 will release. The larger the output power of the laser 12, the larger the spot size can be made, the larger the row pitch can be set, and the faster the beam can be scanned (up to the speed limit of the scanner 16) resulting in maximum throughput of the debonding system 10.

Apart from the system 10 itself another parameter of interest is the ablation threshold fluence of the release (ablation) material 4.

It can be shown that debonding by UV ablation begins at a minimum threshold fluence controlled primarily by the absorption and thickness of the material being ablated. As mentioned above, the ablation material 4 should adhere well both to the glass handler 1 and the bonding adhesive 3. The ablation material 4 should also be thermally stable up to at least the maximum bonding temperature, it should be highly absorbing at the wavelength of interest (e.g., 355 nm), and for ease of optical inspection of the bonded interface throughout 3D wafer processing, it should be as transparent as possible at optical wavelengths. There exists a class of materials used in advanced deep-UV lithography known variously as inert underlayer (UL) films, spin-on carbon (SOC) films and organic planarizing layers (OPL). At least some of these materials meet the requirements imposed for wafer bonding/debonding and can be used to form the ablation material layer 4.

For example, OPL materials are conventionally used to planarize pre-existing patterns to enable lithography of the subsequent level. They are typically spin-applied to a thickness on the order of 200 nm and then baked (e.g., using a hotplate) to yield optically transparent films. Most are thermally stable up to 300° C. and several are stable above this temperature. At least some OPL materials can be used for the ablation layer 4, for example, one that when applied as a 260 nm thick film on glass transmits only about 15% of the incident beam and another that when applied as a 200 nm film transmits only about 30% of the incident beam.

In accordance with examples of the embodiments of this invention, the problem related to the cost of materials for the wafer bond and debond can be reduced by enabling reuse of at least a portion of the bonding adhesive.

Further in accordance with examples of the embodiments of this invention a double release layer (double ablation layer) can be used, with one adjacent to the handle wafer or panel and one adjacent to the component wafer, die, package, sub-component, battery or other item to be bonded and debonded.

In one example the same laser and laser wavelength can be used for the release layers on both sides of the adhesive layer. In another example two different release layers can be used, with one being absorptive of a first wavelength such as light having a wavelength of 355 nm (UV or some other UV wavelength) and the other being absorptive of a second wavelength of 1.1 um to >10 um (in the infrared (IR) spectrum). The embodiments of this invention enable the use of two or more lasers with different wavelengths or two or lasers at the same wavelength, or one laser.

Further in accordance with examples of the embodiments of this invention a fixture such as etched silicon or glass wafers or panels can be employed to reduce adhesive use over bumps, pillars or other 3D shapes. For example an etched glass wafer or silicon wafer with etched features such as holes or cavities that match the corresponding bumps or pillars for a component wafer can be used where bumps and pillars fit into the wafer fixture and adhesive is used to join the surfaces of the component wafer and the fixture and/or handle wafer.

Further in accordance with examples of the embodiments of this invention the adhesive material can be used and reused after being released by laser energy or by chemical removal, and the adhesive can then be reclaimed. Alternatively a thermal plastic can be left attached to the handle wafer and new adhesive can be added to functional hardware (die, wafer, package, panel, as adhesive/release layer for a debonding post bond cycle). The thermal plastic can be reused in-situ or it can be removed from the handle wafer by laser or chemical cleaning and reclaimed/reprocessed into another adhesive or adhesive/release layer.

Further in accordance with examples of the embodiments of this invention there is provided an ability to use a double release process to peel off the adhesive layer rather than simply dissolving it.

The use of these embodiments lowers the wafer cost of ownership (COO) based on high throughput bond and debond operations.

The use of these embodiments provides an option to process at the wafer, die, package, component, sub-component or panel level, and gives the option to debond at each of these levels.

The embodiments of this invention also provide in one aspect thereof a precision tool that can both cut and debond components and that can be used in fabrication applications such as electronics, optics and touch screens (as non-limiting examples). The precision cut and release process for components can employ one or more lasers. One example is the use of a pico-second laser such as, but not limited to, a 355 nm laser in conjunction with a debonding laser which can be same laser or another laser such as 355 nm solid state or IR laser which can release the wafer or hardware by debonding. Kerf between components can be debonded and removed for subsequent access to the one or more components by component transfer and/or bonding. The embodiments can use the same laser with different optics for cutting versus debonding, or can use two separate lasers and optics for cutting and debonding in the same tool.

The embodiments can use two processes in the same tool which can reference precision alignment marks for cutting and debonding. The tool can process with the sequential use of single laser with two sets of optics for cutting and releasing; or the tool can parallel process with the simultaneous use of multiple lasers and optics to increase throughput.

Figure 4:
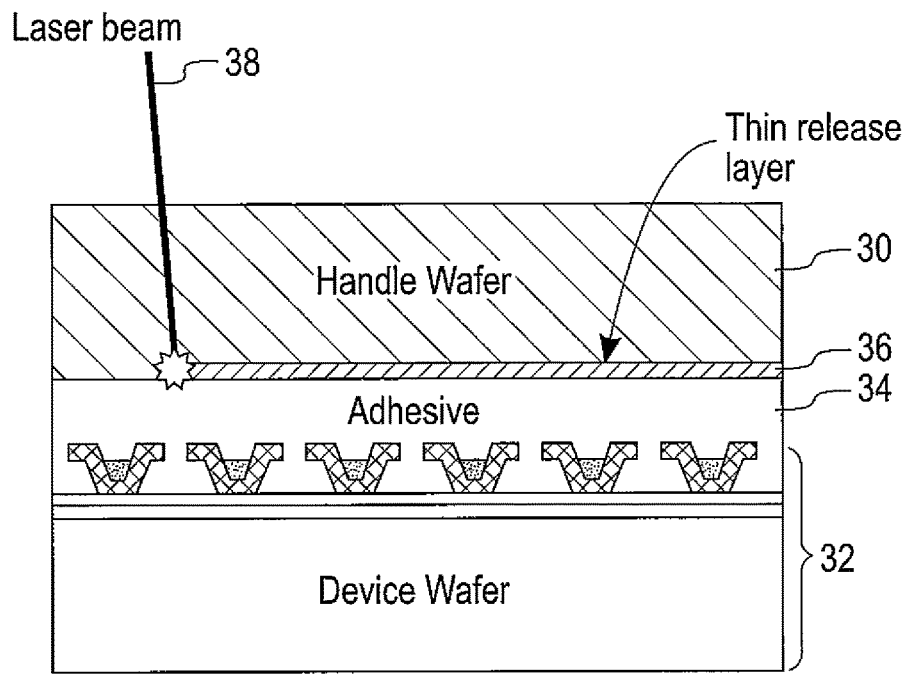
FIG. 4 illustrates a conventional debonding approach.

FIG. 4 illustrates a debonding approach based on the foregoing FIGS. 1 and 3 that uses a glass and/or a Si handle wafer 30. A device substrate 32 (e.g., a wafer) typically includes various features including, for example, transistors and metallization (interconnects, vias, etc.). Over the substrate 32 and beneath the handle wafer 30 is an adhesive layer 34 and a thin release layer (ablation layer) 34. A laser beam 38 is shown passing through the substantially transparent handle wafer 30 and thermally removing the release layer 36 to debond the handle wafer 30. This can be a room temperature process. This approach enables the use of tape/frame technology. Subsequently the adhesive layer 34 can be removed with a suitable chemical process, such as by the application of a solvent selected to dissolve the adhesive layer 34. Before debonding the bonded handle wafer/wafer combination can be subjected to various processes including, for example, wafer thinning (e.g., 100 μm, 50 μm, 30 μm) and, if desired, a compatible edge grinding operation can be applied—all without damage to the device wafer 32.

Figure 5:
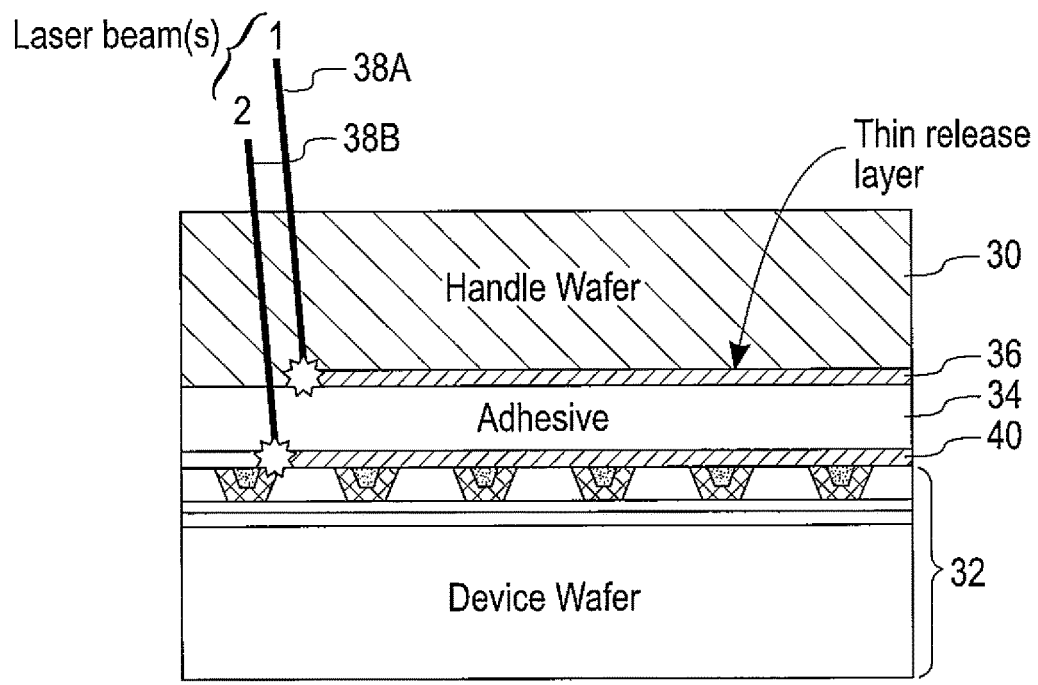
FIG. 5 illustrates a debonding approach in accordance with some embodiments of this invention where a bonded structure includes a second release layer interposed between the adhesive layer and a top surface of the device wafer, and two scanned laser beams.

FIG. 5 illustrates a debonding approach and a bonded structure in accordance with some embodiments of this invention. Comparing FIG. 5 to FIG. 4 it can be seen that a second release layer 40 is interposed between the adhesive layer 34 and the top surface of the device wafer 32 (or a functional die, panel or component(s)). It can also be seen that two laser beams 38A and 38B are used, with the laser beam 38A being selected and applied to remove (at least one of decompose, ablate and vaporize) the top-most release layer 36 and the laser beam 38B being selected and applied to remove (at least one of decompose, ablate and vaporize) the bottom-most release layer 40. In this case the adhesive layer 34 is selected to at least partially transmit the laser energy of beam 38B.

The beams 38A and 38B could be sourced by the same laser and associated beam optics, or they could be sourced by two different lasers and associated beam optics. The wavelengths of the beams 38A and 38B could be the same (e.g., if the release layer 36 is removed first and if the adhesive layer 34 is at least partially transparent to the beam wavelength), or they could be different. As non-limiting examples, one beam such as 38A could have a wavelength in the UV spectrum and could be sourced by an excimer laser or by a downconverted DPSS laser, while the second beam 38B could have a wavelength in the IR spectrum and could be sourced by an IR laser (or by the DPSS laser with the downconversion optics removed or bypassed).

An optional blocking layer (not shown) can be placed next to the top surface component wafer 32 to protect the wiring and devices from the laser. The optional blocking layer can be any absorptive or reflective material (at least at the wavelength of the second laser beam 38B). The optional blocking layer could also be present in any of the embodiments depicted in FIGS. 6 and 7 that are described below. Examples of a blocking layer include a thick release layer which does not permit the laser fluence to pass. The blocking layer could be composed of a carbon-filled polymer, an appropriate metal layer or alternate material that preferably would have high absorbance in the spectrum of the laser wavelength being used. After processing, the blocking layer can also be removed by means of; for example, a chemical clean or oxygen ash process.

It can be appreciated that in this embodiment the layer 34 of adhesive itself is freed from the structure after the removal of the release layers 36 and 40. The freed adhesive layer 34 can be subsequently recovered such as by a simple washing operation. After recovery the adhesive material of the layer 34 can be recycled and possibly reused thereby reducing the overall cost of wafer processing. The adhesive can be single use or dual or multiuse use and can be reclaimed by being chemically removed from wafers, filtered and/or concentrated and reused again.

In these embodiments of this invention a debonding method includes removing the adhesive layer 34 such as by laser release layer or multiple laser release layers, adhesive release without the use of a release layer, chemical dissolution or mechanical removal, combinations of removal methods or by alternate method(s). The removed adhesive layer material can then be segregated, filtered and processed to capture all or a subset of the adhesive layer material(s) so as to be reclaimed, re-concentrated, cleaned, adjusted for targeted next-use properties to create value for the chemical or chemicals to be reused or used in an alternate application. The chemical adhesive layer 34 can be reused after the debonding, where reuse can involve one or more of reconstitution such as with a solvent, classification by molecular weight, viscosity, composition, or other parametric variable(s) in part or full when combined with other new and/or reconstituted chemicals.

Figure 6:
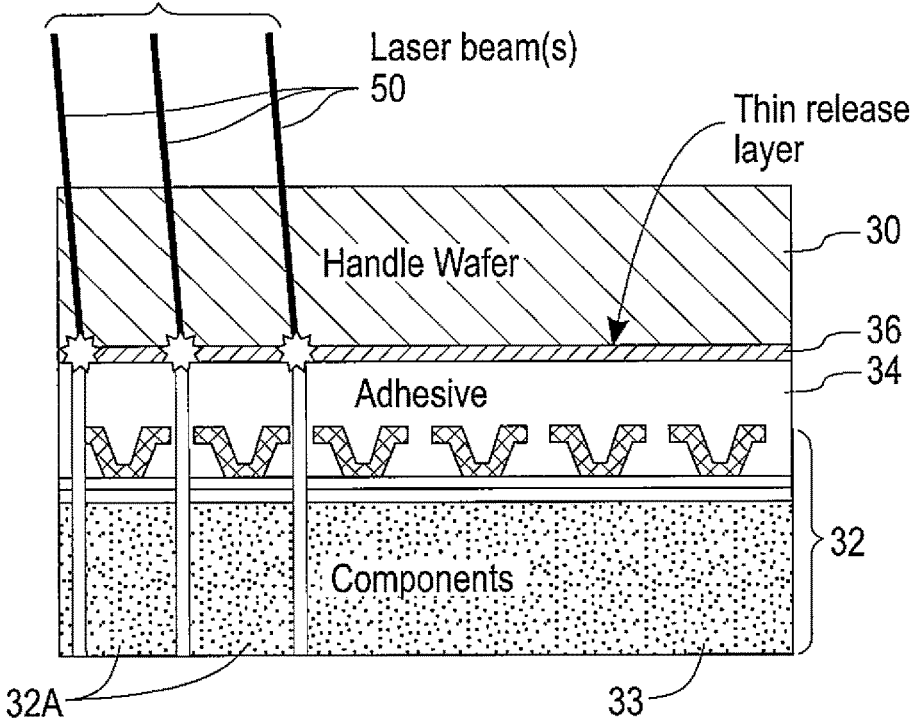
FIGS. 6 and 7 illustrate a non-limiting example of an etch and/or cut and debond embodiment of this invention, where
Figure 7:
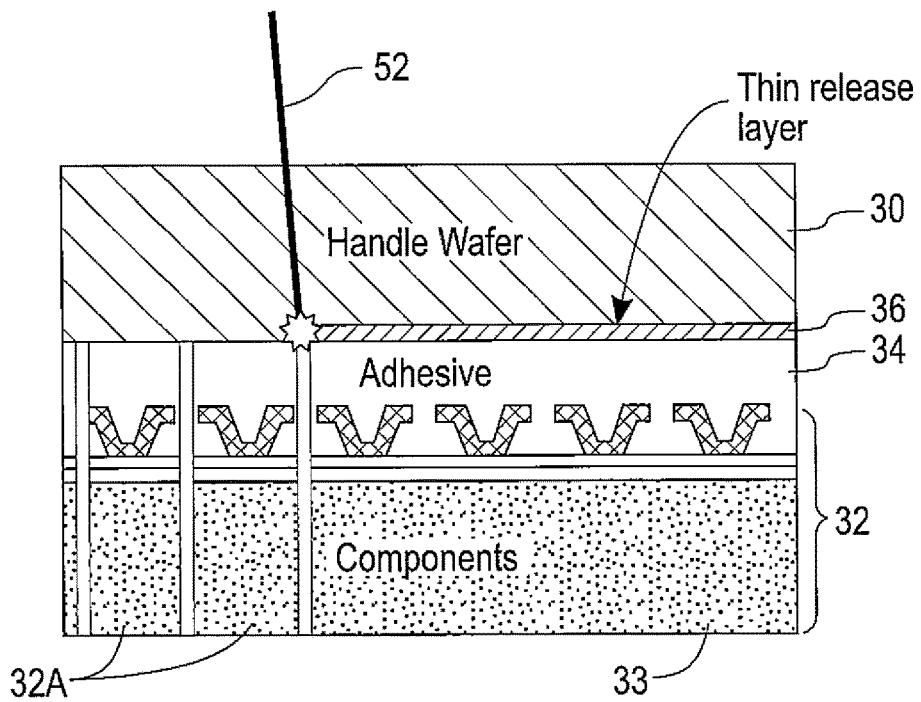

FIGS. 6 and 7 illustrate a non-limiting example of a cut and debond embodiment of this invention, where FIG. 6 shows a laser cutting (scribing) operation and FIG. 7 shows a laser debonding operation. In this embodiment the structure can be, for example, as illustrated in FIG. 4 with the single release layer 36, although in other embodiments the double release layer example of FIG. 5 could be used.

FIG. 6 shows the application of one or more laser beams 50 to the structure through the handle wafer 30. The beams(s) 50 pass through the handle wafer 30 but are strongly absorbed in the underlying release layer 36, adhesive layer 24 and device substrate (component bearing substrate) 32. The laser beam(s) 50 are applied with sufficient power to cut through the underlying release layer 36, adhesive layer 24 and device substrate 32. However, the substantially transparent handle wafer 30 (to the wavelength of the cutting beam(s) 50) is not cut through and thus holds the underlying cut device substrate sub-structures 32A (and overlying adhesive layer and release layer) in position due to the presence of the adhesive layer 34. The cutting laser beam(s) 50, output from one or more lasers, can be provided by, in one non-limiting example, a scanned Q-switched laser outputting UV wavelengths in a non-limiting range of about 240 nm-360 nm It is pointed out that in the embodiment of FIG. 6 the cutting beam(s) 50 could be applied instead from the bottom, i.e., through a bottom surface 33 of the device substrate 32.

FIG. 7 shows the application of an additional laser beam 52 to the structure through the handle wafer 30. The beam 52 passes through the handle wafer 30 and is strongly absorbed in the underlying release layer 36 and functions to remove (at least one of decompose, ablate and vaporize) the release layer 36 thereby separating the previously cut sub-structures 32A from the handle wafer 30.

In these embodiments it is to be noted that x-y scanning of the laser beam(s) could be accomplished by scanning the beam(s) themselves while holding the device substrate 32 and related layers stationary, or by holding the laser beam(s) stationary while translating the device substrate 32 and related layers relative to the beam(s), or by moving both the beam(s) and the device substrate 32 and related layers.

The embodiments of this invention provide in one aspect thereof a double debond and/or chemical clean for material reclaim/reuse and can employ at least one or two laser debond wavelengths or directions (i.e., 355 nm and 1 μm to 3 μm and/one or two directions (i.e., top only or bottom only, or both).

The embodiments of this invention provide in another aspect thereof for the use of the two release layers 36 and 40 located above and below the adhesive layer 34. The embodiments provide as well for the use of one adhesive layer with an integrated release layer.

The embodiments of this invention provide in another aspect thereof for the use of at least one release layer and for the reuse of a thermal plastic for bond and debond, and the reuse of some or all of the adhesive layer.

In some embodiments a chemical cleaning process can be used to remove some or all of release layer and/or some or all of the adhesive layer.

The embodiments of this invention provide in another aspect thereof an ability to pattern the device substrate 32 to form dice of the component substrate and the release of one or more release layers or kerf.

The embodiments of this invention provide in another aspect thereof an ability to use one or more lasers to release sub-components from a die, a wafer, or a panel. The embodiments can be used with semiconductor wafers containing a multiplicity of die, with solar panels, and with display panels, as non-limiting examples.

The embodiments of this invention also provide for laser cutting and debonding during the precision cutting and debonding of one or more components.

The embodiments of this invention also provide in another aspect thereof an ability to use one laser and multiple optical paths for either debond or cutting or both, or to use two (or more) lasers and associated optical paths for cutting and debonding operations. The use of two or more lasers can be advantageous to achieve higher throughput. The structure can be cut from the handle wafer side or from the component wafer side.

The embodiments of this invention also provide in another aspect thereof for an option to have preset parameters for laser cutting versus laser debonding, while considering different materials that comprise the structure being cut/debonded and the direction (top or bottom) from which the structure is cut.

The embodiments of this invention also provide in another aspect thereof for an integrated laser beam size and location characterization and for integrated software and a camera 24 (shown in FIG. 3) to recognize reference marks and feature recognition to cut by scanning in X and Y dimensions with potentially a theta (rotation) adjustment. The (optional) camera 24 and related image recognition software could thus be integrated with the optical system/controller shown in FIG. 3 to enable the identification and accurate location of reference marks and indicia on the component substrate 32 thereby aiding in the process of debonding only, as in FIG. 5, or cutting and debonding as in FIGS. 6 and 7. The (optional) camera 24 and related recognition and other software provides for feature recognition and an ability to release full sheets, individual components or multiple components. The released components could be a line of components or a two dimensional area array of components or, in general, any regularly shaped or irregularly shaped block of components. The components can be released at one time or in a stepped sequence enabling alignment to other components or holding fixtures.

An aspect of the embodiments of this invention is the application of light having a predetermined wavelength to the bonded structure to at least one of decompose, ablate and vaporize the release layer thereby debonding at least two bonded sub-structures from the second wafer or surface. In this non-limiting embodiment, the sub-structures can be either partially etched for creation of cavities, partially etched for the purpose of separating the sub-structures, or fully etched for the purpose of separating the sub-structures, in addition to causing release from the base handle wafer and/or surface.

In each of the non-limiting embodiments described herein the equipment that comprises the system can utilize a discrete or integrated set of photo-detector(s) for the purpose of evaluating the laser spot size and/or location of the laser spot in coordination with an equipment surface such that, with software and alignment marks in wafers, packages and or other components or layers, the X and Y position and with energy sensing, the one or more laser beams can be monitored for controlling the precision of beam location and energy, laser spot and/or fluence. Such calibration sensors when combined with software programs and knowledge of the materials and components can lead to both precision debonding, etching and/or cutting of one or more features when using features or alignment marks on the wafers or components to be processed. The discrete or integrated set of photo-detector(s) could be used in conjunction with the camera 24 or in place of the camera 24.

The release layer(s) 36 and 40 can be selected to strongly absorb a frequency of light radiated from the laser. Light that is radiated from the laser could be ultraviolet light. The light radiated from the laser may have a wavelength of approximately 350 nm (or less) to 360 nm (or more). The laser used for ablating the release layer may be, for example, a YAG laser or a XeF excimer laser. The adhesive layer 34 may be applied to the semiconductor wafer 32. The release layer 36 may be cured prior to bonding the semiconductor wafer 32 to the transparent handler 30 with the release layer applied thereto. The adhesive layer 34 may be applied to the release layer 36. The release layer 36 may be cured prior to applying the adhesive layer 34.

The laser used for ablating the release layer 36 and/or 40 may be a diode-pumped solid-state (DPSS) laser. The laser used for ablating the release layer 36 and/or 40 may be an excimer laser. The laser used for ablating the release layer 36 and/or 40 may be a relatively low power laser compared to an excimer laser. The relatively low power may be in the range from approximately 5 Watts to 30 Watts. Processing the semiconductor wafer 32 while it is bonded to the transparent handler 30 may include thinning the semiconductor wafer 32. Processing the semiconductor wafer 32 while it is bonded to the transparent handler 30 may include creating one or more through-silicon via (TSV).

The release layer(s) 36 and 40 may be substantially transparent to visible light and a method may include inspecting the semiconductor wafer 32 through the transparent handler 30 and the release layer 36 and/or 40 after the processing of the semiconductor wafer 32 and prior to ablating the release layer(s). Repairs may be performed on the semiconductor wafer 32 prior to ablating the release layer(s) when the inspection reveals a correctable defect. The semiconductor wafer 32 may be added to a 3D stack after removing the semiconductor wafer 32 from the transparent handler 30.

The handle wafers can be any combination of wafers for glass, sapphire, silicon, polymer carriers or alternate materials that are compatible with the optical wavelengths output from the one or more lasers. It can be noted that for the glass handle wafer 30 the optical wavelength could be 355 nm (UV), for the silicon handle wafer 30 the IR laser can output a wavelength such as 1 μm to 5 μm. For a polymer handle wafer 30 the laser and output wavelength can be selected depending on transmission characteristics of the polymer.

In some embodiments the transparent handler 30 may include Borofloat glass. The transparent handler 30 may be substantially transparent to ultraviolet and visible light. The transparent handler 30 may be, as a non-limiting example, approximately 650 μm thick.

The device wafer 32 may include integrated circuit elements. The device wafer 32 may include one or more through-silicon via (TSV). The device wafer 32 may be a layer for a 3D integrated circuit, 3D package or alternate package, a touch screen display, a sensor, a bio-medical device, a battery or other hardware.

The adhesive layer 34 is selected to have desired properties such as a thermal plastic with viscosity control for bonding and processing compatible with targeted use and temperature and chemical compatibility/resistance with used parameters, and debonding compatible such as with a chemical clean and/or oxygen ashing process. The adhesive layer 34 may be, for example, one known as TOK A0206. The release layer 36 and/or 40 may include an adhesive. The release layer 36 and/or 40 may include, for example, HD3007. The release layer 35 and/or may include cyclohexanone. The adhesive layer may be from <1 um to about 100 um thick as a non-limiting thickness range. The release layer 36 and/or 40 may be, as a non-limiting example, an approximately <0.2 to <1 µm thick layer wherein high laser absorption is used with controlled composition of the release layer. The release layer 36 and/or 40 may be vulnerable to ablation by ultraviolet laser radiation. The release layer 36 and/or 40 may be vulnerable to ablation by ultraviolet laser radiation of a power within the non-limiting range of approximately <1 Watt to 30 Watts. The release layer 36 and/or 40 may be vulnerable to ablation by infrared laser radiation.

According to exemplary embodiments of the present invention, the bonding adhesive 34 may be applied to either the glass handler wafer 30 (e.g., after the UV ablation layer is added) or to the device wafer 32. Because the UV ablation layer controls the glass release, the adhesive may be chosen irrespective of its UV absorption characteristics thereby increasing the choices for adhesives. For relatively low-temperature wafer applications (e.g. up to about 250° C.) a wide variety of materials exist (e.g. TOK TZNR-0136) which can be bonded at low pressures and temperatures (<1 atmosphere, approximately 200° C.). A typical bonding cycle for such a material takes place in a bonding tool where the glass and Si wafers 30 and 32 are held in alignment but separated by a small gap to allow a vacuum to be created between the wafer and the handler before the two are brought into contact. The wafers are heated to the desired bonding temperature while they are pressed together. Bonding cycles are typically on the order of 3 to 5 minutes. For higher temperature applications (e.g. approximately 300° C. to approximately 350° C.) the adhesive choices are fewer, and include BCB and polyimide-based materials such as HD Microsystems HD3007. These are generally much less viscous once cured, and may be bonded at higher pressures and temperatures (>1 atmosphere, approximately 3000° C. to approximately 350° C.). The adhesive chosen may be spin applied at approximately 500 to approximately 3000 rpm, soft-baked at between approximately 80° C. and approximately 120° C. and then cured at between approximately 300° C. and approximately 350° C. for up to an hour in nitrogen. Bonding cycles may be on the order of approximately 20 to approximately 40 minutes for these materials. Alternate bonding adhesives may utilize a chemical additive to enhance the speed of bonding and or curing by means of viscosity adjustment or chemical adjustments for UV curing or partial curing.

Figure 8:
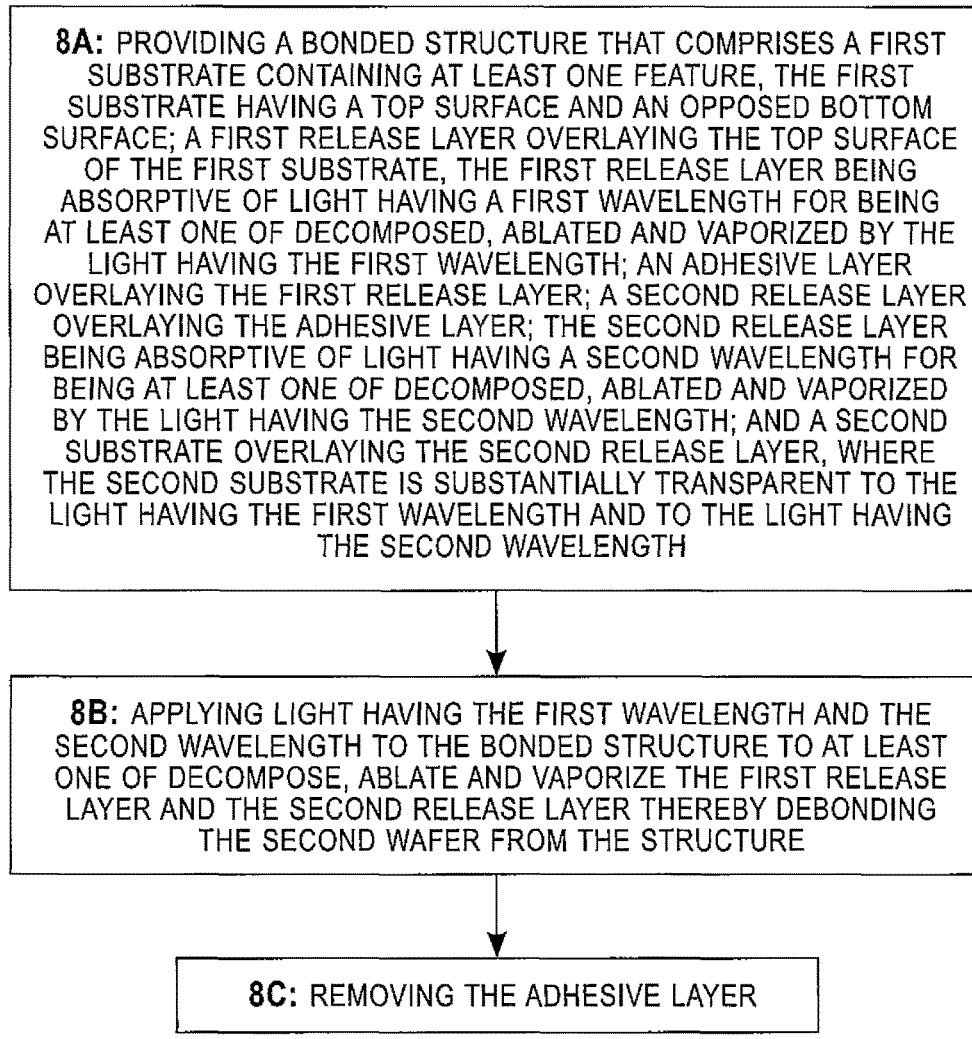
FIG. 8 is a flow chart descriptive of a first method of this invention.

FIG. 8 is a flowchart that is descriptive of an embodiment of a method in accordance with an aspect of this invention. At Block 8A the method provides a bonded structure that comprises a first substrate containing at least one feature, the first substrate having a top surface and an opposed bottom surface; a first release layer overlying the top surface of the first substrate, the first release layer being absorptive of light having a first wavelength for being at least one of decomposed, ablated and vaporized by the light having the first wavelength; an adhesive layer overlying the first release layer, a second release layer overlying the adhesive layer; the second release layer being absorptive of light having a second wavelength for being at least one of decomposed, ablated and vaporized by the light having the second wavelength; and a second substrate overlying the second release layer, where the second substrate is substantially transparent to the light having the first wavelength and to the light having the second wavelength. The method further comprises at Block 8B applying light having the first wavelength and the second wavelength to the bonded structure to at least one of decompose, ablate and vaporize the first release layer and the second release layer thereby debonding the second wafer from the structure. The method further comprises at Block 8C removing the adhesive layer.

FIG. 9 is a flowchart that is descriptive of a further embodiment of a method in accordance with an aspect of this invention. At Block 9A the method provides a bonded structure that comprises a first substrate containing at least one feature, the first substrate having a top surface and an opposed bottom surface; an adhesive layer overlying the top surface of the first substrate; a release layer overlying the adhesive layer; the release layer being absorptive of light having a predetermined wavelength for being at least one of decomposed, ablated and vaporized by the light having the second wavelength; and a second substrate having a bottom surface overlying the release layer and an opposed top surface, the second substrate being substantially transparent to the light having the predetermined wavelength. At Block 9B the method further comprises applying a focused beam of light to the bonded structure to cut through the release layer, the adhesive layer and the first substrate to form at least two bonded sub-structures, where the second substrate is substantially transparent to the focused beam of light. At Block 9C the method further comprises applying light having the predetermined wavelength to the bonded structure to at least one of decompose, ablate and vaporize the release layer thereby debonding the at least two bonded sub-structures from the second wafer or surface.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent bonding/debonding processes, including optical scanning processes and release layer removal processes, may be used by those skilled in the art. Further, the exemplary embodiments are not intended to be limited to only those materials, layer thicknesses, wavelengths and the like that were specifically disclosed above. Any and all such and similar modifications of the teachings of this invention will still fall within the scope of this invention.

What is claimed is:

1. A method, comprising:
   providing a bonded structure that comprises a first substrate containing at least one feature, the first substrate having a top surface and an opposed bottom surface; an adhesive layer overlying the top surface of the first substrate; a curable polyimide release layer overlying the adhesive layer; the curable polyimide release layer, the adhesive layer, and the first substrate being absorptive of a first beam of light having a predetermined wavelength; and a second substrate having a bottom surface and an opposed top surface, the bottom surface overlying the release layer, the second substrate being substantially transparent to the first beam of light having the predetermined wavelength;
   applying the first beam of light having the predetermined wavelength to the bonded structure to scribe the curable polyimide release layer, the adhesive layer, and the first substrate; and
   applying a second beam of light of a predetermined wavelength to the bonded structure, the second substrate being substantially transparent to the second beam of light of the predetermined wavelength, to at least one of decompose, ablate, and vaporize the curable polyimide release layer to debond the curable polyimide release layer from the second substrate, thereby separating at least two sub-structures from the second substrate.

2. The method as in claim 1, wherein the first beam of light having the predetermined wavelength is applied to the top surface of the second substrate.

3. The method as in claim 1, wherein the first beam of light having the predetermined wavelength is applied to the bottom surface of the first substrate.

4. The method as in claim 1, wherein the second beam of light having the predetermined wavelength is applied to the top surface of the second substrate.

5. The method as in claim 1, further comprising removing at least a portion of the adhesive layer that covers the portion of the first substrate of each of the debonded sub-structures.

6. The method as in claim 1, wherein the first substrate comprises a semiconductor substrate and wherein the second substrate comprises one of a semiconductor substrate, a sapphire substrate, a glass substrate, and a polymer substrate.

7. The method as in claim 1, wherein the second substrate is cleaned by means of at least one of chemical cleaning and oxygen/plasma ashing and reused.

8. The method as in claim 1, performed by a tool that comprises at least one laser, optics, optical scanner, and alignment and power sensors to support precision debonding, cutting for wafers, panels, and other form factor structures and to support at least one of wafer thinning, miniaturization, component segmentation, and cavity formation.

9. The method as in claim 1, wherein one laser is used to apply both the first beam of light having the predetermined wavelength and the second beam of light having the predetermined wavelength over multiple optical paths.

10. The method as in claim 1, wherein a first laser is used to apply the first beam of light having the predetermined wavelength and wherein a second laser is used to apply the second beam of light having the predetermined wavelength.

11. A method, comprising:
    providing a bonded structure that comprises,
       a first substrate containing at least one semiconductor feature, the first substrate having a top surface and an opposed bottom surface; an adhesive layer overlying the top surface of the first substrate; a release layer overlying the adhesive layer, the release layer, the adhesive layer, and the first substrate being absorptive of a first beam of light having a predetermined wavelength; and
       a second substrate having a bottom surface and an opposed top surface, the bottom surface overlying the release layer, the second substrate being substantially transparent to the first beam of light having the predetermined wavelength;
    applying the first beam of light having the predetermined wavelength to the bonded structure to scribe the release layer, the adhesive layer, and the first substrate; and
    applying a second beam of light of a predetermined wavelength to the bonded structure, the second substrate being substantially transparent to the second beam of light of the predetermined wavelength, to at least one of decompose, ablate, and vaporize the release layer to debond the adhesive layer and the first substrate from the second substrate.

* * * * *